(12) United States Patent
Aoyama et al.

(10) Patent No.: US 7,399,365 B2
(45) Date of Patent: Jul. 15, 2008

(54) AQUEOUS FLUORIDE COMPOSITIONS FOR CLEANING SEMICONDUCTOR DEVICES

(75) Inventors: Tetsuo Aoyama, Ikoma (JP); Toshitaka Hiraga, Setagaya-ku (JP); Tomoko Suzuki, Setagaya-ku (JP)

(73) Assignee: EKC Technology, Inc., Hayward, CA (US)

( * ) Notice: Subject to any disclaimer, the term of this patent is extended or adjusted under 35 U.S.C. 154(b) by 419 days.

(21) Appl. No.: 10/826,319

(22) Filed: Apr. 19, 2004

(65) Prior Publication Data

US 2005/0014667 A1      Jan. 20, 2005

(51) Int. Cl.
*B08B 3/04* (2006.01)
*C11D 7/50* (2006.01)

(52) U.S. Cl. .................. 134/2; 134/3; 134/26; 134/28; 510/175; 510/176

(58) Field of Classification Search ...................... 134/2, 134/3, 26, 28; 510/175, 176
See application file for complete search history.

(56) References Cited

U.S. PATENT DOCUMENTS

| | | | |
|---|---|---|---|
| 5,911,836 A * | 6/1999 | Hada et al. ...................... 134/2 |
| 5,981,454 A | 11/1999 | Small | |
| 6,508,887 B1 * | 1/2003 | Park et al. ...................... 134/2 |
| 6,514,352 B2 * | 2/2003 | Gotoh et al. .................... 134/3 |
| 6,773,873 B2 * | 8/2004 | Seijo et al. .................. 430/329 |
| 2002/0066465 A1 | 6/2002 | Gotoh et al. | |
| 2003/0082912 A1 | 5/2003 | Kezuka et al. | |
| 2004/0038254 A1 | 2/2004 | Muramatsu et al. | |

* cited by examiner

*Primary Examiner*—Michael Barr
(74) *Attorney, Agent, or Firm*—Morgan Lewis & Bockius LLP

(57) ABSTRACT

The present invention relates to dilute fluoride solutions and methods for cleaning plasma etch residue from semiconductor substrates including such dilute solutions. The compositions and methods according to the invention can advantageously provide both cleaning efficiency and material compatibility.

4 Claims, 8 Drawing Sheets

After Cleaning

Inital

Top Views of Via Arrays
SEM image and AES map, 45 sec via open process

AQUEOUS FLUORIDE COMPOSITIONS FOR CLEANING SEMICONDUCTOR DEVICES

FIELD OF THE INVENTION

The present invention relates to dilute fluoride compositions that are useful for removing resist and etching residue from semiconductor substrates, memory devices, liquid-crystal panel elements, and electrodes, and also toward the methods of using the compositions. The compositions and methods according to the invention can advantageously provide both cleaning efficiency and material compatibility with a variety of low-K substrates, and have high removing performance at a room temperature, do not corrode electro-conductive metal films, are highly safe, and can be easily handled.

BACKGROUND OF THE INVENTION

Generally, in a manufacturing process of highly integrated semiconductor elements a resist film is first applied on an interconnection material such as a metal film which becomes an interconnection for electric conduction, and on an interlayer insulating film material which ensures insulation between interconnections. A desired resist pattern is formed by photolithography, dry etching is conducted using the resist film as a mask, then the remaining resist film is removed by plasma ashing and then wet treatment using a cleaner and residue remover composition to remove resist residue remaining on the interconnection material and the interlayer insulating material.

To fulfill the demand for faster processing speed from semiconductor, the conventional Al or Al alloy used as the interconnection material has been replaced with Cu or Cu alloy, typically using a known damascene process. A barrier film, which may be silicon nitride, and a Low-k film are successively formed on the substrate, and a resist mask is then formed. Next, the exposed Low-k film is dry etched to expose the barrier film, so that a via hole is formed. At this time, reactive products of the gas used for the dry etching and the Low-k film and the resist film accumulate in the via hole as resist residue. Then, the resist film is removed by plasma ashing, leaving a modified film on the surface of Low-k film according to the reaction of the resist to heat and plasma during ashing. Then the resist residue is removed by processing with a fluoride-based cleaning composition. To ensure the removal of the resist residue, a cleaning composition likely to evenly etch the insulating film has been used, and the via holes are enlarged. The common interlayer dielectrics, low-K dielectrics, CORAL, TEOS, SiOC, porous MSQ, SiON, and boron phosphosilicate glass (BPSG), which are commonly used in semiconductors for better conformity of step coverage, is usually removed with HF solutions. Now, however, conventional p-TEOS films or the like are being replaced with Low-k films having a lower dielectric constant than the p-TEOS film. Examples of the Low-k film currently regarded as promising include a film formed of inorganic material such as porous silica or the like, a film formed organic material such as polyimide, polyarylene or the like, and a film formed of a mixture of the above-mentioned inorganic and organic materials. Additionally, conventional i-line resists are being replaced with a chemically amplified excimer resist, such as KrF excimer resist, ArF excimer resist or the like, and a efficient cleaning composition for these new compositions is needed. Subsequently, a resist film patterned for trench formation is formed on the Low-k film, and, using the resist mask, the Low-k film is dry etched down to its intermediate position to form a trench. Resist residue that is the reactive product of the gas used for the dry etching and the Low-k film accumulates in the via hole and trench. The resist film is removed by plasma ashing, and resist residue is removed by processing with a conventional fluorine type compound-based cleaning composition. The conventional cleaning composition removes the resist residue and also etches the surface of the Low-k film, so that the internal diameter of via hole is further enlarged and the width of trench increases. Then, the barrier film, e.g., silicon nitride, is removed by dry etching to expose buried copper interconnections. Then, the surface of the copper interconnection is cleaned with a cleaning composition. In the conventional fluoride-based cleaning compositions, a copper corrosion inhibitor such as benzotriazole (BTA) has been added to prevent corrosion of the copper interconnection. With such a cleaning composition, however, there is a problem that the copper corrosion prevention interferes with attempts to improve the resist residue removing action. Finally, copper is filled in the via hole and trench by plating or the like.

Normally the fluoride-based cleaner and residue remover used as the last process step are called "RCA rinses", and they beneficially remove monolayer amounts of metal, anions and/or organic contaminants and/or surface residues (e.g., particles). Using fluoride chemistries (usually HF) as a final RCA cleaning step will cause the silicon wafer surface to be in a hydrophobic state (the surface is covered with Si—H groups) which will repel water. During this step a certain proportion of the wafer surface is dissolved (removed). Unless the conditions are carefully monitored (time, temperature, solution composition) the substrates can be damaged, for example as the Low-k film is further etched to further narrow the interval between interconnections. This would cause degradation in characteristics, such as a decrease of driving speed of semiconductor element due to increased electric capacity between the interconnections, or a defect such as short-circuit between the interconnections. It is not uncommon for the HF to also attack the dielectric material. Such attack, which may include introduction of water, disruption of the structure, swelling, and the like, is not desirable. Accordingly, a need exists for a less damaging cleaning formulation.

The requirement for cleaning solutions that remove all types of residue generated as a result of plasma etching of various types of metals, such as aluminum, aluminum/silicon/copper, titanium, titanium nitride, titanium/tungsten, tungsten, silicon oxide, polysilicon crystal, and the like, while not corroding the underlying metal nor altering the dielectric presents a need for more effective chemistry in the processing area. The effect of poor cleaning results in low device yield, low device reliability, and low device performance.

It is desirable to develop an improved cleaning composition to remove the organic polymeric substance from a coated inorganic substrate without corroding, dissolving or dulling the metal circuitry or chemically altering the wafer substrate.

In addition, stripping compositions used for removing photoresist coatings and cleaning composition for removing post-etch residue have for the most part been highly flammable solvent mixtures exhibiting an undesirable degree of toxicity. Disposal is therefore costly.

There is also a need to remove particulate residues from the wafer surfaces during the BEOL process. The compositions are useful for post-CMP cleaning, particularly with substrates having tungsten.

There are five mechanisms for removing impurities (particles and/or ions) from the wafer surfaces:

1. Physical desorption by solvents, which involves replacing a small number of strongly absorbed particles with a large volume of weakly adsorbed solvent (changing the interaction of the surface charges);

2. Change the surface charge with either acids or bases, i.e., the Si—OH group can be made positive or protonated with acid or made negative with bases by removing the proton;

3. Ion complexion by removing adsorbed metal ions by adding acid (i.e., ion exchange);

4. Oxidation or decomposition of impurities, which involves oxidation of metals, organic materials or the surface of slurry particles, will change the chemical forces between the impurities and substrate surface. The chemical reaction can either be through redox chemistry or free radicals; and 5. Etching the oxide surface, which releases the impurity while dissolving a certain thickness of the substrate surface.

Currently available fluoride-based chemistries can help in items #2 and 5, but the cleaning conditions must be carefully controlled. Accordingly, there exists a need to develop improved cleaning compositions to efficiently clean a variety of deposits from a wide variety of substrates. Particularly in the field of integrated circuit fabrication, it should be recognized that the demands for improved cleaning performance with avoidance of attack on the substrates being cleaned are constantly increasing. This means that compositions that were suitable for cleaning less sophisticated integrated circuit substrates may not be able to produce satisfactory results with substrates containing more advanced integrated circuits in the process of fabrication. The cleaning compositions should also be economical, environmental friendly and easy to use.

The present invention teaches such a new and improved cleaning composition and a process for its use. This composition is aqueous, meaning it contains some water. This formulation dissolves both organic and inorganic substances, and, when used in the process, is able to clean a variety of substrates without damage.

It is a general object of the invention to provide a semiconductor substrate cleaning composition that is effective at low temperatures, e.g., less than 40° C., preferably less than 30° C., for example, ambient temperatures. It is a further object of the invention to provide a post etch residue cleaning composition that inhibits re-deposition of metal ions. It is a further object of the invention to provide such a cleaning solution having low etch rates of metal or metal-containing semiconductor layers, particularly metallic or reactively etched layers of copper or low-k dielectrics. It is a further object of the invention to provide such a cleaning solution and a process which removes post etch residues from metal structures. It is a further object of the invention to provide such a cleaning solution and a process which removes post etch residues from vias. It is a further object of the invention to provide such a cleaning solution and a process which removes post etch residues from low-k dielectrics, e.g., CVD-SiON films. It is further an object of the invention to provide a cleaning solution, which has reduced tendency to etch or to alter the low-K dielectrics. These and related objects are attained through the use of the composition and process disclosed herein.

SUMMARY OF THE INVENTION

A composition in accordance with this invention, for the cleaning of residues from substrates comprising particularly low-K material and copper, comprises: a first component which is a fluoride-containing salt with a metal-free base having between 0 and 4 carbon atoms; a second component which is water; a third component which is water-soluble amide; a fourth component which is water-soluble ether; a fifth component which is a di-, tri-, or tetra-alkylamine having less than 8 carbon atoms, alkyl-alkanolamine or dialkyl-alkanolamine; and a sixth component which is sulfamic acid, phosphonic acid, or a derivative thereof, wherein the pH (hydrogen ion concentration) is 5.5 to 8.5, preferably 6.5 to 8, for example 7 to 8.

Further, a manufacturing method of a semiconductor device according to the present invention includes the step of forming a metal film having copper as its main component on a semiconductor substrate, the step of forming an insulating film such as a Low-k film thereon, the step of forming a resist film further thereon, the step of providing a hole or a trench in the insulating film by way of dry etching using the resist film as a mask, the step of removing the resist by gas plasma processing or heat treatment, and the step of removing, using the cleaning composition for removing resists as described above, resist residue generated due to reaction between etching gas and the resist film and the insulating film at the time of dry etching. The etching gas used in he present invention includes fluorocarbon as its main component, and the resist residue generated according to the reaction between the etching gas and the resist film and the insulating film such as the Low-k film includes resist residue, carbon residue and a composite thereof.

Further, another manufacturing method of a semiconductor device according to the present invention includes the step of forming a metal film having copper as its main component on a semiconductor substrate, the step of forming an insulating film such as a Low-k film thereon, the step of forming a resist film further thereon, the step of providing a hole or a trench in the insulating film by performing dry etching with the resist film as a mask, and the step of removing, using the cleaning composition for removing resists as described above, the remaining resist film and resist residue generated due to reaction between etching gas and the resist film and the insulating film at the time of dry etching.

As such, the cleaning composition for removing resists according to the present invention exhibits excellent removing efficiency of the resist residue and excellent corrosion-proof effects on the copper interconnection film and the insulating film. Accordingly, it is possible, during the manufacture of the semiconductor device, to prevent narrowing of an interval between the copper interconnections, degradation in characteristics such a decrease of driving speed of semiconductor elements, and a defect such as short-circuit between the interconnections.

Further, yet another manufacturing method of a semiconductor device according to the present invention includes the step of forming a metal film having copper as its main component on a semiconductor substrate, the step of forming an insulating film thereon, the step of providing a hole in the insulating film reaching the metal film by dry etching, and the step of removing, using the cleaning composition for removing resists as described above, etching residue generated due to reaction between etching gas and the insulating film during the dry etching.

The etching gas used in the present invention includes fluorocarbon as its main component, and thus, the main component of the etching residue produced according to the reaction between the dry etching gas and the insulating film or the metal film including copper as its main component, is carbon residue. The cleaning composition for removing resists according to the present invention is capable of removing not only the resist and the resist residue but also the etching residue not including the resist or the resist residue. Herein, the metal having copper as its main component means that the content of copper within the relevant metal is greater than 51 weight %, e.g., at least 90 wt %.

The preferred dilute aqueous cleaner and residue remover contains:
- from 0.02% to 0.18% by weight of a fluoride-containing compound selected from the group consisting of ammonium fluoride, alkylammonium fluorides, ethanolamine fluoride, ammonium biflouride, alkylammonium bifluorides, or a mixture thereof;
- between 15% to 35% by weight water;
- from 59% to 84% by weight total of an amide and an ether solvent,
- from 0.2% to 5% by weight of an acid selected from sulfamic acid, phosphonic acid, a soluble phosphonic acid derivative, or mixture thereof; and
- from 0.2% to 5% by weight of an alkanolamine.

Another preferred embodiment is the above cleaner, but containing:
- from 0.02% to 0.18% by weight of a fluoride-containing compound selected from the group consisting of ammonium fluoride, alkylammonium fluorides, ethanolamine fluoride, ammonium biflouride, alkylammonium bifluorides, or a mixture thereof;
- between about 15% to about 35% water by weight;
- between 10% and 40% by weight of an amide;
- between 20% and 59% by weight of a glycol ether;
- between 0.2% to 5% by weight of an acid selected from sulfamic acid, phosphonic acid, a soluble phosphonic acid derivative, or mixture thereof; and
- between 0.2% to 5% by weight of an alkanolamine, wherein the pH is between 6 and 8.

Another composition in accordance with this invention contains:
- between 0.02% and 0.18% by weight, preferably between 0.06% and 0.15%, of fluoride-containing compound, preferably ammonium fluoride 12125-01-8;
- between 10% and 40% by weight, preferably between 20% and 30%, of an amide, preferably N,N-Dimethylacetamide (DMAC) 127-19-5;
- between 20% and 60% by weight, preferably between 40% and 55%, of a glycol ether, more preferably Diethylene glycol monobutyl ether (DEGBE), 112-34-5;
- between 0.1% and 10% by weight, preferably between 0.5 and 6% of one or more of sulfamic acid 5329-14-6, phosphonic acid 13598-36-2, or derivative thereof, for example Amino tris(methylenephosphonic acid) (ATMP) 6419-19-8, more preferably between 1 and 3% of sulfamic acid;
- between 0.1% and 20% by weight, for example between 0.5% and 5%, of one or more alkanolamines, for example 2-(2-aminoethylamino)-ethanol (AEEA), N,N-Diethylethanolamine 100-37-8, or amines, for example amines containing less than six carbon atoms, or the like;
- between 10% and 40% by weight, for example between 15 and 35%, water 7732-18-5; and
- optionally between 0.01% and 1% by weight of a chelator, a corrosion inhibitor, or a mixture thereof, including for example carboxylic acids such as citric acid, glycolic acid, and the like, poly-hydroxybenzenes such as dihydroxybenzenes (catechol, pyrocatechol), benzotriazole, and the like; wherein the pH of this composition is 5.5 to 8.5, preferably from 6 to 8, for example from 7 to 8.

However, we have found that the inclusion of the corrosion inhibitors were not necessary (with the tightly controlled concentration limits described here) and required undesirable longer rinse times, so the cleaning and residue removing composition is preferably substantially free or, more preferably completely free of corrosion inhibitors. By "substantially free of corrosion inhibitors" we mean less than 0.05% by weight, preferably less than 0.01%. We subsequently surprisingly found that a composition substantially free, preferable completely free, of the corrosion inhibitors, and in preferred embodiments substantially free of chelators, would allow the same level of residue remover activity and less interaction with the substrate of provided sulfamic acid and preferably also provided certain classes of amines or alkanolamine were included.

Therefore, another composition in accordance with this invention contains:
- between 0.02% and 0.18% by weight, preferably between 0.06% and 0.15%, of fluoride-containing compound, preferably ammonium fluoride, ammonium bifluoride, or mixture thereof,
- between 10% and 40% by weight, preferably between 20% and 30%, of one or more amides, preferably a N-methyl, N-ethyl-acetamide, N,N-Dimethylacetamide, or N,N-diethylacetamide, most preferably N,N-Dimethylacetamide;
- between 20% and 60% by weight, preferably between 40% and 55%, of one or more ethers, for example Diethylene glycol monobutyl ether and/or Diethylene glycol monopropyl ether, more preferably Diethylene glycol monobutyl ether;
- between 0.5% and 6% by weight, preferably between 0.5% and 3% of sulfamic, for example between 1 and 3% of sulfamic acid;
- between 0.1% and 20% by weight, preferably between 0.5% and 5%, of one or more N-alkylalkanolamines and/or N,N-Dialkylalkanolamine where the alkyl moieties are methy-, ethyl (preferred), propyl, or butyl and wherein the alkanolamine base is ethanolamine (preferred), propanolamine, or isopropanolamine, most preferably N,N-Diethylethanolamine; and
- between 10% and 50% by weight, for example between 15 and 35%, water; wherein the pH of this composition is between 6 to 8.5, preferably from 6 to 8, for example from 7 to 8.

The inclusion of small quantities of chelators, particularly polyfunctional carboxylic acids such as citric acid or glycolic acid, were useful in some cleaning situations. But generally, chelators can be included in small amounts (e.g., between 0.01% and 0.1%), or alternatively the chelators could be deleted, especially if high purity (e.g., electronic quality, having very low metals content) ingredients were used to make the formulation. The use of the sulfamic acid provided excellent protection against metal ion re-deposition.

Another embodiment of the above composition contains:
- between 0.06% and 0.15% by weight, preferably between 0.08% and 0.15%, of ammonium fluoride;
- between 20% and 30% by weight, preferably between 24% and 30%, of N,N-Dimethylacetamide;
- between 40% and 55% by weight, preferably between 40% and 50%, of Diethylene glycol monobutyl ether;
- between 0.5% and 6% by weight, preferably between 0.5% and 3% of sulfamic, for example between 1% and 3% of sulfamic acid;
- between 0.5% and 5% by weight, preferably between 1% and 4% of one or more of N-ethyl, N-propylethanolamine, N,N-dipropylethanolamine, and/or N,N-diethylethanolamine, more preferably N,N-diethylethanolamine; and between 15% and 35% by weight, for example between 15% and 30%, water, wherein the pH of this composition is 6 to 8, preferably between 7 to 8.

In each composition described above, the amounts of the amide and the ether can be interchanged, depending on the type of resist to be removed. The above composition is the best overall composition for removing a variety of resists and residues, if not optimum for some resists.

The invention also includes a process for cleaning residue from a substrate that has a residue or other undersirable material thereon, where the method comprises contacting the substrate with the composition comprising one or more fluoride compounds and polar organic solvent(s) as described above and herein at a temperature between about 15° C. and about 45° C., preferably between about 25° C. and 35° C., and for a time sufficient to clean the substrate, for example between 30 seconds and eight minutes, preferably between one minute and three minutes, where contacting is done by spraying, dipping, impacting, or other method. Beneficially there is sufficient turbulence to allow the composition easy access to vias and the like where residue may exist.

Furthermore, these and other objects of the present invention have been accomplished by a method for removing resist which comprises the steps of: (I) forming a resist layer on a substrate having a metal film; (II) light-exposing the resist layer through a mask pattern and subsequently developing the resist layer to form a resist pattern; and (III) dry-etching the substrate using the resist pattern as a mask and then removing the unnecessary resist and modified resist film with the above-described remover solution composition for resist.

DETAILED DESCRIPTION OF PREFERRED EMBODIMENTS

Figure 1:
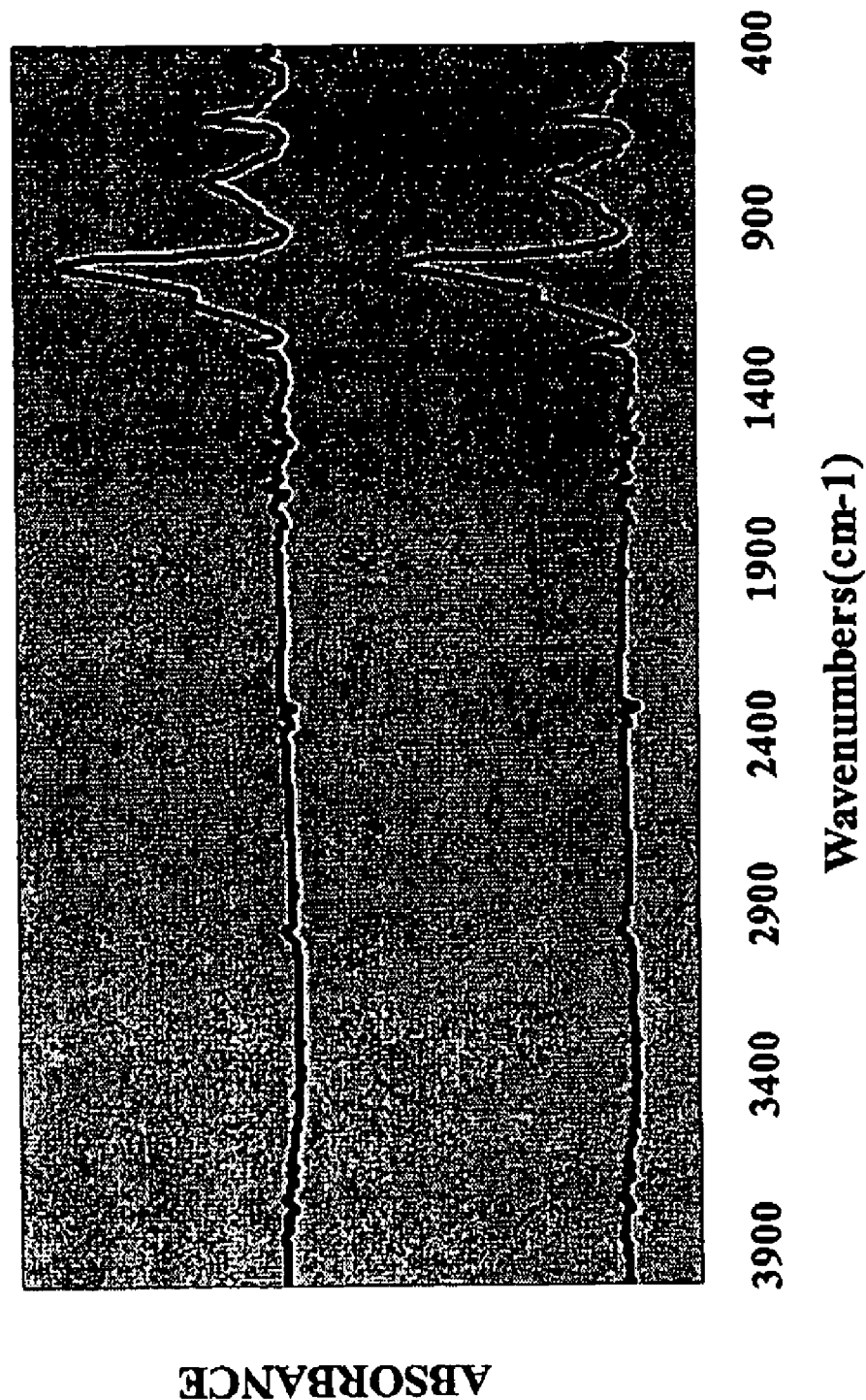
FIG. 1 shows the effect of a fluoride-containing cleaner/remover on a SiOC substrate.

Unless otherwise specified, all percentages expressed herein should be understood to refer to percentages by weight. Also, unless otherwise specified, the term "about," when used in reference to a range of values, should be understood to refer to either value in the range, or to both values in the range.

As used herein, unless otherwise defined, the phrases "contains substantially no" and "substantially free from," in reference to a composition means:

for major components (not fluoride-containing compounds) including polar organic solvents (which include non-hydroxyl-containing amines), water, organic solvents, hydroxylamine and hydroxylamine derivatives, alkanolamines, and the like, the aforementioned phrases should be understood to mean that the composition contains less than 1.5%, preferably less than about 1%, more preferably less than about 0.1%, of the specific element mentioned thereafter;

for minor components including acid components, chelating agents, corrosion inhibitors, surfactants, and the like, the aforementioned phrases should be understood to mean that the composition contains less than about 0.1%, preferably less than about 0.01%, more preferably less than about 0.005%, of the specific element mentioned thereafter; and for trace contaminants such as metals or metal ions, the aforementioned phrases should be understood to mean that the composition contains less than about 50 ppm, preferably less than about 10 ppm. Preferably, when one of the aforementioned phrases is used, the composition is completely free of any added element specifically mentioned thereafter, or at least does not contain the added element in an amount such that the element affects the efficacy, storability, usability regarding necessary safety concerns, or stability of the composition.

Dilute fluoride solutions according to the present invention can conveniently be used to clean plasma ash residues from semiconductor substrates. Cleaners and residue removers that are dilute and that contain relatively inexpensive components are desired in the industry, because the cost of producing cleaners and residue removers is largely driven by the high cost of components contained therein.

In one embodiment the invention is a cleaning and residue removing composition comprising:

a fluoride-containing compound, such as hydrogen fluoride, mono-, di-, tri-, or tetra-alkylammonium fluoride (preferably having 4 or less carbon atoms), ammonium fluoride, ammonium biflouride, or mixtures thereof, present in the solution in an amount from about 0.01% to less than 0.2%, preferably from about 0.02% to about 0.18%, for example from about 0.05% to 0.14% by weight or from about 0.08% to about 0.13%;

water;

a mixture polar organic solvent(s), preferably an amide and a glycol ether, wherein the total of water and polar organic solvent(s) are present in an amount of at least about 85%, and in a preferred embodiment at least about 92%, for example at least about 94%, by weight;

sulfamic acid, or phosphonic acid or derivative such as amino tris methylenephosphonic acid, a ethylenediamine tetra methylenephosphonic acid, a hexamethylenediamine tetra methylenephosphonic acid, a diethylenetriamine penta methylenephosphonic acid, a 1-Hydroxy ethane diphosphonic acid, or mixture therof; and an alkaline compound, such as an alkanolamine as described herein, preferably ethanolamine or a derivative thereof, present in the solution in an amount from about 0.2% to about 5%, preferably from about 0.5% to about 3%, for example from about 0.8% to about 2.5% by weight.

The alkaline component can optionally be a quaternary ammonium compound (i.e., not including fluoride salts) as described herein, such as choline hydroxide, salts of choline derivatives such as bis and tris choline, or mixtures thereof, present in the solution in an amount from about 0.2% to about 5%, preferably from about 0.5% to about 3%, for example from about 1% to about 2.5% by weight; optionally, a hydroxylamine, preferably hydroxylamine or diethylhydroxylamine, present in the solution in an amount from about 0.1% to about 5%, preferably from about 0.2% to about 3%, for example from about 0.5% to about 1%, by weight not including the counterion of the salt if present;

The cleaner can further optionally contain: a chelating agent, for example catechol, EDTA, DTPA, or mixtures thereof, present in the solution in an amount from about 0.1% to about 8%, for example from about 0.5% to about 2% by weight, an amine (that is not hydroxylamine derivative, an acid compound, a polar organic solvent, or an alkanolamine), present in the solution in an amount from about 0.1% to about 20%, for example from about 0.5% to about 4% by weight; and, a surfactant, for example, an epoxy-polyamide compound, present in the solution in an amount from about 0.01% to about 3%, for example from about 0.1% to about 0.5% by weight.

In one embodiment, the dilute cleaner solution consists essentially of:

about 0.05% to less than 0.15% by weight of a fluoride-containing compound, preferably ammonium fluoride;

about 92% to about 97% by weight of water and at least one polar organic solvent, but may also include and preferably does include water, a polar amide solvent such as dimethylacetamide or DMSO, and polar glycol ether such as diethylene glycol monobutyl ether;

about 1% to about 3% of an alkanolamine compound, preferably N,N-diethylethanolamine; and about 1% to about 2% of an inorganic acid, preferably phosphonic acid, sulfamic acid, or derivative thereof.

In this embodiment, when water, dimethylacetamide (DMAC), and diethylene glycol monobutyl ether (DEGBE) are the polar solvents, it is preferable that the water is present in an amount from about 20% to about 25% by weight, the DMAC from about 20% to about 30%, and the DEGBE from about 45% to about 50%.

In another embodiment, the dilute cleaner solution consists essentially of:

about 0.05% to less than 0.15% by weight of a fluoride-containing compound, preferably ammonium fluoride;

about 90% to about 95% by weight of water and at least one polar organic solvent, preferably including water, dimethylacetamide, and diethylene glycol monobutyl ether;

about 0.5% to about 1.5% of an alkanolamine compound, preferably N,N-diethylethanolamine; and about 2% to about 3% of at least one acid compound, preferably phosphonic acid, amino-tris(methylenephosphonic acid), or mixture thereof.

In this embodiment, when water, dimethylacetamide, and diethylene glycol monobutyl ether are the polar organic solvents, it is preferable that the water is present in an amount from about 30% to about 40% by weight, the DMAC from about 40% to about 50%, and the DEGBE from about 10% to about 15%. Also in this embodiment, when phosphonic acid and amino-tris(methylenephosphonic acid) are the acid compounds, it is preferable that the phosphonic acid is present in an amount from about 2% to about 2.9% and that the amino-tris(methylenephosphonic acid) is present in an amount from about 0.05% to about 0.5%.

In still another preferred embodiment, the dilute cleaner solution consists essentially of:

about 0.05% to about 0.1% by weight of a fluoride-containing compound, preferably ammonium bifluoride;

about 98% to about 99.8% by weight of water and at least one polar organic solvent, preferably including water and dimethylacetamide; and either (a) about 0.1% to about 1% by weight of an alkanolamine compound, preferably monoethanolamine, N-alkylethanolamine or N,N-alkylethanolamine, or (b) about 0.1% to about 1% by weight of a chelating agent, preferably a non-metallic EDTA salt, more preferably tetraammonium EDTA.

In this embodiment, when water and dimethylacetamide (DMAC) are the polar organic solvents, it is preferable that the water is present in an amount from about 30% to about 40% by weight and that the DMAC is present in an amount from about 60% to about 70%.

Unless specifically stated, concentrations of other compounds are specified on 100% basis, even if the compound is ordinarily supplied as an aqueous solution (e.g., hydroxylamine is typically supplied as a 50% solution in water).

In this specification, dilute solution is defined as containing at least about 75% by weight solvent(s), preferably at least about 85% by weight, for example at least about 90% by weight or at least about 95% by weight. In one embodiment, the concentration of solvent(s) in the dilute solutions according to the invention is from about 75% to about 95% by weight. In another embodiment, the concentration of solvent(s) in the dilute solutions according to the invention is from about 90% by to about 95% by weight.

Preferably, the dilute fluoride solution according to the invention is substantially free of abrasive particles such as typical metal oxide abrasives (e.g., alumina, silica, ceria, zirconia, magnesia, and the like).

The dilute fluoride solutions may also include a fluoride compound for improved utility as cleaners. Suitable fluoride compounds include, but are not limited to, ammonium fluoride, ammonium bifluoride, hydrogen fluoride, alkylammonium fluoride, alkylammonium bifluoride, and the like, and mixtures thereof. In one embodiment, ammonium fluoride and alkylammonium fluorides are preferred fluoride compounds. In an alternate embodiment, ammonium bifluoride and alkylammonium bifluorides are preferred fluoride compounds. In the most preferred embodiment, the fluoride-containing compound is predominately ammonium fluoride. The fluoride-containing compound can be an alkanolamine salt of hydrofluoric acid. Or, or course, the fluoride-containing compound can be a mixture of any of the above.

The base fluoride component is preferably ammonium or a mono-, di-, tri-, or tetra-alkyl ammonium compound having 4 or less carbon atoms, or hydroxylamine or an alkyl-substituted hydroxylamine having 4 or less carbon atoms, or monoethanolamine, or mixtures thereof. Larger base ions provide insufficient cleaning activity. The preferred base is ammonia. The fluoride component improves removing efficiency of the chemically amplified excimer resist after dry etching, by reacting with the agent for generating acid with light that is included in the chemically amplified excimer resist.

Further, the content of the fluoride component is from 0.02 weight % to 0.25 weight %, and if the base of the fluoride component is predominately ammonium, the content of the fluoride component is preferably between 0.02 and 0.18%. If it is less than 0.02%, the stripping efficiency of the resist film, resist residue and other etching residue would be degraded. If it exceeds 0.25% (0.18% for ammonium fluoride), then undesired interactions with the Low-k film would become undesirably intense.

Preferably, the fluoride-containing compound is ammonium fluoride, ammonium bifluoride, or both, more preferably ammonium fluoride.

In one embodiment, the dilute solution according to the invention can be substantially free from hydrogen fluoride, substantially free from bifluorides, or substantially free from both. In another embodiment, the dilute solution according to the invention can be substantially free from hydrogen fluoride.

In one embodiment, the fluoride-containing compound is present in the solution in an amount from about 0.001% to less than 0.2%, preferably from about 0.02% to about 0.18%, for example from about 0.1% to about 0.15% by weight.

Organic solvents may be either polar or non-polar. Generally, non-polar organic solvents are not preferred, though high boiling alcohols and the like may be used. In one embodiment, therefore, the solution according to the invention can be substantially free from non-polar organic solvents.

Examples of polar organic solvents for the composition according to the invention include ethylene glycol alkyl ethers, diethylene glycol alkyl ethers (e.g., monomethyl ether, monoethyl ether, monopropyl ether, monobutyl ether, etc.; dimethyl ether, diethyl ether, dipropyl ether, dibutyl ether, etc,; methyl ethyl diether, methyl propyl diether, methyl butyl diether, ethyl propyl diether, ethyl butyl diether, propyl butyl diether, etc., and the like), triethylene glycol alkyl ether, propylene glycol alkyl ether, and the like.

The preferred glycol ethers include ethylene glycol monomethyl ether, ethylene glycol monoethyl ether, ethylene glycol monopropyl ether, ethylene glycol monobutyl ether, ethylene glycol monohexyl ether, diethylene glycol monomethyl ether, diethylene glycol monoethyl ether, diethylene glycol monopropyl ether, diethylene glycol monobutyl ether, diethylene glycol monohexyl ether, triethylene glycol monomethyl ether, triethylene glycol monoethyl ether, propylene glycol monomethyl ether, propylene glycol monoethyl ether, propylene glycol monopropyl ether, propylene glycol monobutyl ether, dipropylene glycol monoethyl ether, dipropylene glycol monopropyl ether, dipropylene glycol monobutyl ether and others.

The more preferred glycol ethers are ethylene glycol monobutyl ether, ethylene glycol monopropyl ether; most preferably ethylene glycol monobutyl ether. While other ethers are less prone to evaporation, the ethylene glycol monobutyl ether provides excellent cleaning (when combined with an amide) with little interaction with low-K substrates.

A wide variety of amides are commonly used, for example formamide, N-methyl formamide, N,N-dimethyl formamide, N-ethyl formamide, N,N-diethyl formamide, acetamide, n-methyl acetamide, N,N-dimethyl acetamide, N-ethyl acetamide, N,N-diethyl acetamide, dimethyl sulfoxide, N-substituted pyrrolidones such as N-methyl-2-pyrrolidone, and others. We have found that N,N-dialkylacetamide is preferable to the dialkylformamides.

Dialkylacetamides such as Dimethylacetamide and diethylene glycol alkyl ethers (most notably diethylene glycol monobutyl ether) are preferred polar organic solvents, and are most preferably used in combination. Dialkylacetamides such as Dimethylacetamide and diethylene glycol alkyl ethers (most notably diethylene glycol monobutyl ether) are preferably used together with water, where each component is present in an amount greater than about 20%.

Although the mixed mass ratio of amides and glycol ethers is not limited specifically, the following can be said from the standpoint of removing efficiency of the chemically amplified excimer resist after dry etching. That is, when removing the resist for KrF excimer laser, since its main framework is poly (hydroxy styrene) of a phenol framework, it is preferable to have a higher ratio of amides that are highly soluble thereto. By comparison, when removing the resist for ArF excimer laser whose main framework is acrylic, it is preferable to have a higher ratio of glycol ethers that are highly soluble thereto. The same standpoint applies to the resist residue after ashing. In other words, the mixed mass ratio of amides and glycol ethers may be determined according to the kind of resist to be used before dry etching.

In particular, it is advantageous to use the mixture of amides and glycol ethers as the in the case where the resist for ArF and the resist for KrF are employed together in manufacture of one and the same semiconductor device. In such a case, it is particularly preferable, from the standpoint of solubility of both resists, that the mixed mass ratio of amides is 0.3-0.5.

In one embodiment where polar organic solvents are present, the boiling point of the polar organic solvent(s) is (are) at least about 95° C. Care must be taken because, in the absence of alkanolamines and the like, certain organic solvents may be only slightly miscible with water, if present, in the dilute fluoride solution according to the invention.

In another embodiment, where the dilute solution according to the invention contains water and at least one other polar organic solvent, the water can advantageously be present in an amount from about 15% to about 45% by weight, for example from about 20% to about 40% by weight, alternately from about 15% to about 30% by weight, from about 20% to about 25% by weight, from about 25% to about 45% by weight, or from about 30% to about 40% by weight. The amount of water should be controlled because it, along with a fluoride compound, can alter certain low-K substrates. In preferred embodiments of the invention, water is present in an amount between about 20% and about 35%. In that embodiment, the at least one other polar organic solvent can advantageously be present in an amount from about 50% to about 85% by weight, for example from about 55% to about 80% by weight, alternately from about 50% to about 70% by weight, from about 55 to about 65% by weight, of about 60% by weight, from about from about 65% to about 80% by weight, from about 70 to about 80% by weight, or of about 75% by weight.

Dilute fluoride solutions may also contain alkaline compounds for improved utility as cleaners. Exemplary alkaline compounds include, but are not limited to, quaternary ammonium compounds (i.e., not including fluoride salts), hydroxylamine or hydroxylamine derivatives, alkanolamines, and mixtures thereof. In some embodiments, an amine can be used as an alkaline compound. In other embodiments, amines qualify only as other additive components.

The formulation comprises an alkaline compound, for example: aliphatic monocarboxylic acid ammonium salt such as ammonium formate, ammonium acetate, ammonium propionate, and ammonium butyrate; aliphatic polycarboxylic acid ammonium salt such as ammonium glycolate, ammonium exalate, ammonium malonate, ammonium succinate, ammonium maleate, ammonium glutanate, and ammonium adipinate, oxycarboxylic acid ammonium salt such as ammonium lactate, ammonium gluconate, ammonium tartrate, ammonium malate, and ammonium citrate; and amino phosphoric acid ammonium salt such as ammonium sulfamate.

In one embodiment, the composition according to the invention optionally contains an amine compound that is not a hydroxyl-containing amine and is not an alkanolamine. Examples of such amine compounds include, but are in no way limited to, o-diaminobenzene, p-diaminobenzene, N-(2-aminoethyl)-ethylenediamine ("AEEDA"), piperazine, N-substituted piperazine derivatives, piperidine, N-substituted piperidine derivatives, diethylene triamine, hexamethylene tetraamine, 2-methyleneaminopropylenediamine, and the like, or a combination thereof. Selected amines will increase corrosion of certain sensitive metals. In an alternate embodiment, the composition according to the invention is substantially free from non-hydroxyl-containing amine compounds (not including amine-containing solvents or hybrid or inorganic acids).

Exemplary quaternary ammonium compounds include, but are not limited to, ammonium hydroxide; alkylammonium compounds such as monoalkylammonium hydroxide, dialkylammonium hydroxide, trialkylammonium hydroxide, and/or tetraalkylammonium hydroxides (e.g., tetramethylammonium hydroxide, choline hydroxide, di(2-hydroxyethyl)dimethylammonium hydroxide, tris(2-hydroxyethyl)methylammonium hydroxide, and the like, and mixtures thereof); and mixtures thereof. While the hydroxide counterion is preferred for these quaternary ammonium compounds, other alternate counterions are also contemplated, including, but not limited to, bisulfite, sulfite, sulfate, nitrate, nitrite, phosphate, phosphite, carbonate, trifluoroacetate, organic carboxylates from organic acids such as those listed herein, and the like, and combinations thereof. Compounds containing two or more ammonium moieties are also useful, both as a cleaning additive and as a chelating agent.

Exemplary hydroxylamine derivatives satisfy the general formula: $X,Y-N-O-R_3$ wherein $R_3$ is hydrogen or a linear, branched, or cyclic hydrocarbon containing from 1 to 7 carbon atoms; and wherein X and Y are, independently, hydrogen or a linear, branched, or cyclic hydrocarbon containing from 1 to 7 carbon atoms, or wherein X and Y are linked together form a nitrogen-containing heterocyclic $C_4$-$C_7$ ring.

Examples of derivatives of hydroxylamine according to the invention include, but are in no way limited to, hydroxylamine; alkylhydroxylamines such as N-methyl-hydroxylamine, N,N-dimethyl-hydroxylamine, N-ethyl-hydroxylamine, N,N-diethyl-hydroxylamine, methoxylamine, ethoxylamine, N-methyl-methoxylamine, N-isopropylhydroxylamine, and the like, and mixtures thereof. It should be understood that hydroxylamine and its derivatives, as defined above, are available (and may be included in a composition according to the invention) as above, as salts (e.g., sulfate salts, nitrate salts, phosphate salts, or the like), or as a combination thereof. In the present invention, these hydroxylamine salts and their derivatives should be characterized as hydroxylamine derivatives herein, and not as quaternary ammonium compounds.

Alkanolamines according to the invention may advantageously be those two-carbon atom linkage alkanolamines having the following structural formula: $X,Y-N-(CR_1R_1')-CR_2R_2')-Z-)-R_3$ wherein $R_1$, $R_1'$, $R_2$, $R_2'$, and $R_3$ are, independently in each case, hydrogen or a linear, branched, or cyclic hydrocarbon containing from 1 to 7 carbon atoms; wherein Z is a group having the formula $-(-Q-CR_1R_1'-CR_2R_2'-)_m-$, such that m is a whole number from 0 to 3 (i.e., when m=0, there is no atom between the $-CR_2R_2'-$ group and the $-OR_3$ group in the formula above), $R_1$, $R_1'$, $R_2$, and $R_2'$ may be independently defined in each repeat unit, if m>1, within the parameters set forth for these moieties above, and Q may be independently defined in each repeat unit, if m>1, each Q being independently either $-O-$ or $-NR_3-$; and wherein X and Y are, independently in each case, hydrogen, a $C_1$-$C_7$ linear, branched, or cyclic hydrocarbon, or a group having the formula $-CR_1R_1'-CR_2R_2'-Z-F$, with F being either $-O-R_3$ or $-NR_3R_4$, where $R_4$ is defined similarly to $R_1$, $R_1'$, $R_2$, $R_2'$, and $R_3$ above, and with Z $R_1$, $R_1'$, $R_2$, $R_2'$, and $R_3$ defined as above, or wherein X and Y are linked together form a nitrogen-containing heterocyclic $C_4$-$C_7$ ring.

Exemplary alkanolamines include, but are not limited to, monoethanolamine (i.e., MEA), monoethanolamine derivatives (e.g., N-methylethanolamine or MMEA, N-ethylethanolamine, N,N-dimethylethanolamine, N,N-diethylethanolamine, N-methyl-N-ethylethanolamine, and the like), 2-(2-hydroxylethylamino)ethanol (i.e., diethanolamine or DEA), 2-(2-aminoethoxy)ethanol (i.e., diglycolamine or DGA), N,N,N-tris(2-hydroxyethyl)-ammonia (i.e., triethanolamine or TEA), isopropanolamine, 3-amino-1-propanol (i.e., n-propanolamine or NPA), 2-amino-1-propanol ("monoisopropanolamine" or "MIPA"), 2-(2-aminoethylamino)ethanol (i.e., aminoethylaminoethanol or AEEA), and mixtures thereof. Monoethanolamine derivatives such as N,N-diethylethanolamine and MEA are preferred alkaline compounds.

The preferred class of alkaline compounds are alkyl-substituted alkanolamines, e.g., N-alkylethanolamine or N,N-dialkylethanolamine, where the alkyl moiety(s) are independently methyl, ethyl, propyl, isopropyl, or butyl, but preferably at least one alkyl moiety is ethyl. N-alkyl(iso)propanolamine or N,N-dialkyl(iso)propanolamine, where the alkyl moiety(s) is independently methyl, ethyl, propyl, isopropyl, or butyl, is also useful.

In one embodiment, alkaline compounds according to the invention may be present in the solution in an amount from about 0.3% to about 5%, alternately from about 0.4% to about 3%, from about 0.5% to about 3%, from about 0.2% to about 1.5%, from about 0.2% to about 2%, from about 0.2% to about 1%, from about 0.5% to about 1.5%, from about 1.5% to about 3%, or from about 1.5% to about 2.5%.

In another embodiment, the solution according to the invention can be substantially free from alkaline compounds. In still another embodiment, the solution according to the invention can be substantially free from alkanolamines, but may contain quaternary ammonium compounds and/or hydroxylamine or hydroxylamine derivatives. In yet another embodiment, the solution according to the invention can be substantially free from hydroxylamine or hydroxylamine derivatives, but may contain quaternary ammonium compounds and/or alkanolamines. In yet another embodiment, the solution according to the invention can be substantially free from quaternary ammonium compounds, but may contain hydroxylamine or hydroxylamine derivatives and/or alkanolamines. In yet another embodiment, the solution according to the invention can be substantially free from quaternary ammonium compounds and hydroxylamine or hydroxylamine derivatives, but may contain alkanolamines. In yet another embodiment, the solution according to the invention can be substantially free from quaternary ammonium compounds and alkanolamines, but may contain hydroxylamine or hydroxylamine derivatives. In yet another embodiment, the solution according to the invention can be substantially free from alkanolamines and hydroxylamine or hydroxylamine derivatives, but may contain quaternary ammonium compounds.

The dilute fluoride solutions may also include acid compounds for improved utility as cleaners. Exemplary acids include, but are not limited to, inorganic acids such as hydrochloric acid, nitric acid, sulfuric acid, periodic acid, perbromic acid, perchloric acid, phosphoric acid, pyrophosphoric acid, phosphonic acid, fluorosilicic acid, sulfuric acid, sulfamic acid, and the like, and mixtures thereof; organic acids such as oxalic acid, lactic acid, citric acid, formic acid, tartaric acid, propionic acid, benzoic acid, ascorbic acid, fumaric acid, gluconic acid, glutaric acid, glycolic acid, malic acid, maleic acid, malonic acid, succinic acid, phthalic acid, gallic acid, 1,2,3-benzenetricarboxylic acid, salicylic acid, butyric acid, isobutyric acid, and the like, and mixtures thereof; other hybrid acids such as methanesulfonic acid, xylenesulfonic acid, toluenesulfonic acid, trifluoroacetic acid, aminotris(methylenephosphonic acid), and the like, and mixtures thereof; and mixtures thereof.

In one embodiment, sulfonic and/or phosphonic acids, or salts or soluble organic derivatives thereof having less than about 10 carbon atoms, are preferred.

In the most preferred embodiment, the acid is at least predominately, and may be completely, sulfamic acid.

Mixtures of any of sulfonic and/or phosphonic acids, or salts or soluble organic derivatives thereof having less than about 10 carbon atoms, and sulfamic acid, are useful.

In one embodiment, these acid compounds according to the invention may be present in the solution in an amount from about 0.5% to about 5%, alternately from about 0.5% to about 3%, from about 1% to about 3%, from about 0.2% to about 1.5%, from about 0.2% to about 2%, from about 0.2% to about 1%, from about 0.5% to about 1.5%, from about 1.5% to about 3%, or from about 1.5% to about 2.5%.

The inorganic acids and/or hybrid acids are preferred acids, with sulfamic acid and phosphonic acid being more preferred inorganic acids and with amino-tris(methylenephosphonic acid) being a more preferred hybrid acid.

In preferred embodiments of the invention, only the fluoride compound(s), the water, the amide(s), the glycol ether(s), the acid(s), and the alkaline component(s) are present. This formulation provides excellent cleaning and very low metal redeposition rates, and does not substantially etch the advanced low-k materials. However, a plethora of optional compounds can be added.

The dilute fluoride solutions may optionally contain additional components such as chelating agents (e.g., those not qualifying as other acid compounds), amines (e.g., those not qualifying as quaternary ammonium compounds, hybrid or inorganic acids, hydroxylamine or hydroxylamine derivatives, polar organic solvents, or alkanolamines, as described above), and/or surfactants. In one embodiment, additional components including, but not limited to, those enumerated above may be added to the solution to achieve a specific goal. In another embodiment, the dilute aqueous solution according to the invention contains substantially no additional components.

According to the present invention, amines, particularly alkanolamines and also particularly low molecular weight amines, are separate from, and are not classified as, a polar organic solvent. Other additional polar organic solvents as known in the art, other than those specifically excluded, can also be used in the composition of the present invention.

Examples of chelating agents include, but in no way limited to, mono-, di-, or multi-hydroxybenzene-type compounds, e.g., such as catechol, resorcinol, butylated hydroxytoluene ("BHT"), and the like, or a combination thereof. In one embodiment the chelators include three or more carboxylic acid-containing moieties, e.g., such as ethylenediamine tetraacetic acid ("EDTA"), non-metallic EDTA salts (e.g., mono-, di-, tri-, or tetra- ammonium EDTA, or the like), and the like, or a combination thereof. Compounds containing two carboxylic acid moieties are less preferred. Compounds containing both hydroxyl and carboxylic acid moieties are useful in one embodiment. Aromatic compounds containing thiol groups, e.g., such as thiophenol; amino-carboxylic acids; diamines, e.g., such as ethylene diamine; polyalcohols; polyethylene oxide; polyamines; polyimines; or a combination thereof, are useful in one embodiment. In one embodiment, one or more chelating agents can be used in one composition, where the chelating agents are selected from groups described above. Alternately or additionally, some chelating agents are described in U.S. Pat. No. 5,417,877, issued May 23, 1995 to Ward, and in commonly assigned U.S. Pat. No. 5,672,577, issued Sep. 30, 1997 to Lee, the disclosures of each of which are incorporated herein by reference. In an alternate embodiment, the composition is substantially free from chelating agents.

In one embodiment, a chelating agent is present in the solution according to the invention in an amount from about 0.1% to about 10%, alternately from about 1% to about 10%, from about 0.5% to about 5%, from about 0.5% to about 3%, from about 0.1% to about 2%, from about 0.25% to about 0.75%, or from about 1% to about 3%.

In one embodiment, the composition according to the invention may also contain a surfactant. Examples of surfactants include, but are in no way limited to, sodium laurel sulfate, sodium stearate, epoxy-polyamide, and the like, or a combination thereof. In an alternate embodiment, the composition according to the invention is substantially free from surfactants.

In one embodiment, a surfactant is present in the solution according to the invention in an amount from about 0.1% to about 10%, alternately from about 1% to about 10%, from about 0.5% to about 5%, from about 0.5% to about 3%, from about 0.1% to about 2%, or from about 1% to about 3%.

The pH of the dilute fluoride solutions may vary considerably from one formulation to another, and the optimum pH can be readily ascertained by evaluating cleaning efficiency and material compatibility at various pH levels. In particular, different pH values are useful with different substrates. In one embodiment, the pH of the solution is between about 5 and about 8.5, alternately between about 6 and about 8.5, between about 6.5 and about 8.5, between about 7 and about 8.5, between about 6.5 and about 7.5, between about 7 and about 7.7, between about 7.8 and about 8.5, at about a neutral pH, at a pH of about 7.5, or at a pH between about 8.0 and 8.2.

In addition, it is preferable that the pH of the dilute fluoride solutions according to the present invention be stable in situ (e.g., in the form of a bath) for a relatively long period of time. In one embodiment, the dilute fluoride solutions according to the present invention have a substantially stable pH in a bath for at least about 12 hours, preferably for at least about 24 hours, for example for at least about 48 hours or for at least 72 hours. As used herein, the term "substantially stable pH" should be understood to mean that the pH of the solution after a given time differs from the original solution pH by less than about 0.5 pH units, preferably by less than 0.2 pH units, for example by less than about 0.15 pH units or by less than about 0.1 pH units.

The dilute fluoride solutions are advantageous for cleaning residues from vias of varying aspect ratios and from metal structures. The metal structures may be simple plugs of metal, such as tungsten, or metal stacks including two or more of titanium nitride, copper, aluminum, aluminum-copper alloys, titanium, tungsten, tantalum, silicon, gallium arsenide, CORAL, platinum, iridium, ruthenium, and other metals useful in semiconductor fabrication, memory devices, RAM electrodes, and the like, as well as mixtures or alloys of the aforementioned metals. Additionally or alternatively, the substrate may include (e.g., as at least a portion of one or more layers) metal nitrides, metal oxides, metal oxynitrides, metal oxycarbides, metal carbonitrides, metal oxycarbonitrides, and/or "metal alloys" with atoms or compounds other than metals (e.g., phosphorus, boron, sulfur, or the like).

The substrates that are subjected to the dilute fluoride solution of the present invention are typically low-K substrates having a barrier layer and possibly copper, where the substrates have been treated with, or etched by, a reactive component that altered their surface chemistry (e.g., a copper surface exposed to a halogen-containing plasma, such as KrF or ArF, or a halide gas, such as $F_2$, may have a copper halide surface).

The dilute fluoride solutions may be applied to the semiconductor substrate through various methods. For instance, application may be as a bath in which the substrate is submerged. Alternately, the aqueous solution may be applied as a spray directed to the surface of the substrate. Mechanical agitation, ultrasonic and megasonic waves, bath circulation, rotation or other motion of the substrate, and other additional steps may be used as is well-known in the art.

The low volatility of the dilute fluoride solutions permits high operating temperature, e.g., up to about 80° C. or higher, of the cleaning process, although "low temperature" operation of about 25° C. to about 35° C. provides a good combination of cleaning efficiency and material compatibility for most applications.

The time required for the cleaning process is dependent upon the residue to be removed, operating temperature and method of application. Typical time is from about 5 seconds to about 30 minutes, alternately from about 15 seconds to about 20 minutes, from about 30 seconds to about 10 minutes, from about 1 to about 5 minutes, from about 1 to about 3 minutes, from about 90 seconds to about 5 minutes, from about 90 seconds to about 3 minutes, or from about 10 seconds to about 2 minutes, and can be readily ascertained by evaluating cleaning efficiency and material compatibility at various times.

A rinse step typically, although not always, follows the application of the dilute fluoride solutions. The rinse material may be water, alcohol such as isopropyl alcohol, a water/alcohol blend, or a rinse material as described in U.S. Pat. No. 5,981,454, the entire disclosure of which is incorporated herein by express reference hereto. Use of a rinse step is preferred, and water is the preferred rinse material.

The composition of the present invention can be advantageously used for any resists including negative and positive resists developable with a cleaner and/or remover solution, e.g., an aqueous alkali solution. Examples of the resists include, but are not limited to: (i) a positive resist comprising a naphthoquinonediazide compound and a novolak resin; (ii) a positive resist comprising an acid-generating compound upon light exposure, a compound which is decomposed by the acid to show enhanced solubility in aqueous alkali solutions, and an alkali-soluble resin; (iii) a positive resist comprising an acid-generating compound upon light exposure and an alkali-soluble resin containing groups which are decomposed by the acid to show enhanced solubility in aqueous alkali solutions; and (iv) a negative resist comprising an acid-generating compound upon light exposure, a crosslinking agent, and an alkali-soluble resin.

The compositions of the invention are particularly useful on low-k dielectrics. Low-k dielectrics are known in the art and include, but are in no way limited to, fluorinated silicate glass (FSG), hydrido organo siloxane polymer (HOSP), low organic siloxane polymer (LOSP), nanoporous silica (Nanoglass), hydrogen silsesquioxane (HSQ), methyl silsesquioxane (MSQ), divinysiloxane bis(benzocyclobutene) (BCB), silica low-k (SiLK), poly(arylene ether) (PAE, Flare, Parylene), fluorinated polyimide (FPI), SiC, and particularly on TEOS, SiOC, SiON, BD, LKD-5109, and CORAL.

In one embodiment, the method for removing resist of the present invention can include applying the resist composition described above to a substrate having a metal film to form a resist layer, light-exposing the resist layer through a mask pattern in an ordinary way, subsequently developing the resist layer to form a resist pattern, dry-etching the substrate by a known technique using the resist pattern as a mask, optionally subjecting the etched substrate to a further treatment, such as ashing, ion implantation, and the like, and then contacting the substrate with the composition of the present invention by immersion or another means to thereby remove the unnecessary resist and modified resist film.

The composition of the present invention can be effective in removing resist films at a low temperature (room temperature) in a short time period even when the resist films had been modified under severe treatment conditions, and generally does not corrode readily corrodible substrates, e.g., Al, Al—Si, and Al—Si—Cu substrates, or peripheral devices. Moreover, the composition of the present invention can be characterized as neutral and relatively safe, can be easily handled, releases substantially no hydrogen fluoride, and can have a further advantage that exhaust and wastewater treatments are easy.

EXAMPLES

A first embodiment of the copper interconnecting process using the cleaning composition of the present invention is described. The initial steps are the conventional steps until the resist residue produced during formation of via hole is removed using the cleaning composition of the present invention. Here, expansion of the internal diameter of via hole is suppressed, since the cleaning composition of the present invention hardly etches Low-k film and/or its process-modified film.

Then, the traditional process steps can proceed until the resist residue produced during formation of the trench is removed using the cleaning composition of the present invention. Here, again, the internal diameter of the via hole and the width of the trench are prevented from increasing, since the cleaning composition of the present invention barely etches Low-k film and its modified film.

Thereafter, silicon nitride film is removed by dry etching to expose a copper interconnection. At this time, etching residue produced according to the reaction of etching gas and the silicone nitride accumulates on the surface of the first copper interconnection. Next, the surface of the copper interconnection is cleaned using the cleaning composition of the present invention. At this time, unlike the conventional cleaning composition, the cleaning composition of the present invention does not corrode the copper interconnection surface. Next, copper is filled in the via hole and the trench by, e.g., MOCVD (Metal Organic Chemical Vapor Deposition), CVD (Chemical Vapor Deposition), employing reflow sputtering, or an organic metal compound. An unnecessary portion thereof is removed by CMP, so that a second copper interconnection is formed. Following CMP, the surface may optionally be cleaned with a composition of this invention. The interval between the copper interconnections is prevented from narrowing, since the cleaning composition of the present invention hardly etches Low-k film and its modified layer. Accordingly, the problems such as degradation in characteristics of semiconductor elements and short-circuit between interconnections are avoided.

Additionally, the same composition is useful for cleaning the large variety of residues from the changing substrates.

In another conventional process, after dry etching of the via hole, plasma ashing is not performed or otherwise performed insufficiently, and resist and resist residue are removed using the cleaning composition of the present invention. The present embodiment is advantageous in that a modified layer is not formed in the surface of Low-k film by the composition of this invention and thus etching of the Low-k film by the cleaning composition is further prevented.

Alternatively or additionally, after dry etching of the trench, plasma ashing is not performed or otherwise performed insufficiently, and resist and resist residue are removed using the cleaning composition of the present invention. Here, again, a modified layer is not formed in the surface of Low-k film, and etching of the Low-k film by the cleaning composition is further suppressed.

Thereafter, the silicon nitride film is removed by dry etching to expose first copper interconnection. At this time, etching residue produced according to the reaction of the etching gas and the silicon nitride accumulates on the surface of the first copper interconnection. Next, the surface of the copper interconnection is cleaned with the cleaning composition of the present invention. Unlike the conventional cleaning composition, the cleaning composition of the present invention does not corrode the copper interconnection surface. Copper is then filled in the via hole and the trench, and an unnecessary portion thereof is removed to form second copper interconnection, as described above.

Removing efficiency of the resist residue produced by dry etching, removing efficiency of the etching residue produced according to the reaction of etching gas and inorganic film, and corrosion preventing effects on copper interconnection and Low-k film of the resist removing cleaner according to the present invention, were evaluated as follows.

(1) Preparation of Cleaning Composition for Removing Resists

The resist removing cleaners in Examples and Comparative Examples each include the fluoride compound, solvents, acids, and water. For preparation of each cleaner, prescribed weight % of the fluoride components and solvents components and 95 weight % of the total required amount of the water were mixed together. Nitric acid and propionic acid as the acid component were added in small amounts to the mixture, to achieve a prescribed pH. The water was then added to obtain 100 mass % of the cleaning composition. The resist removing cleaners in Examples 22-25 each include the the above and also the alkaline components. Each cleaner was prepared as follows.

(2) Removing Efficiency of Resist Residue

An embedded-type first copper interconnection was formed in the silicon oxide film as first insulating film using a common damascene process, where the silicon nitride film of a film thickness of 60 nm as the protective film of the first copper interconnection, and CVD-SiON film (dielectric constant: 2.8) of a film thickness of 600 nm being the Low-k film, were successively formed thereon. A patterned positive resist layer of a film thickness of 400 nm was further formed thereon. Here, as the resist for ArF, the chemically amplified ArF excimer resist including acrylic resin, PAR-101 (manufactured by Sumitomo Chemical Co., Ltd) was employed. As the resist for KrF, the chemically amplified KrF excimer resist including phenol resin, SEPR-430 (manufactured by Shin-Etsu Chemical Co., Ltd.), was employed.

Next, CVD-SiON film being the Low-k film was subjected to dry etching, using a parallel plate RIE at processing pressure of 10 Pa with RF power of 300 W by a mixed gas of fluorocarbon and Ar, to form via hole to expose silicon nitride film. At this time, resist residue accumulated in the via hole. Next, the resist pattern after dry etching was subjected to ashing by plasma using oxygen gas, at a room temperature for 90 seconds. At this time, a modified layer was formed in the surface of Low-k film, and resist residue accumulated on its surface and in via hole. Next, a chip (of a size of 20 mm×20 mm) to which the above resist residue was adhered, was immersed in 200 cm$^3$ of the resist removing cleaner having a composition as shown below, at 24° C. for 30 minutes. It was dried after water washing. Compositions are shown below, with water and acid (nitric) being the balance. As no sulfamic or phosphonic acids were used, all are comparative. The resist was removed with the composition. Data is shown below, where "comp" is a comparitive example, and where X is bad, O is good, and OO is very good.

| (wt. %) | comp. A | comp. B | comp. 1 | comp. 2 | comp. 3 | comp. 4 | comp. 5 | comp. 6 | comp. 7 | comp C | comp D | comp E |
|---|---|---|---|---|---|---|---|---|---|---|---|---|
| Ammonium fluoride | 0 | 0.1 | 0.1 | 0.1 | 0.1 | 0.1 | 0.1 | 0.1 | 0.1 | 0.5 | 0.1 | 0.1 |
| DMAC | 24 | 24 | 24 | 24 | 0 | 24 | 40 | 56 | 80 | 24 | 24 | 24 |
| DGBE | 56 | 56 | 56 | 56 | 80 | 56 | 40 | 24 | 0 | 56 | 56 | 56 |
| pH | 6.5 | 5.5 | 6.5 | 7.5 | 7.5 | 7.5 | 7.5 | 7.5 | 7.5 | 6.5 | 3.5 | 8.5 |
| Resist removal | X | OO | OO | OO | OO | OO | OO | O | O | OO | X | OO |
| Cu corrosion | O | O | O | O | O | O | O | O | O | O | X | X |
| low-K film etching | O | O | O | O | O | O | O | O | O | O | O | X |

The above samples had ArF eximer laser sensitive acrylin resin, which was removed more efficiently at higher glycol ether content. The composition at 8.5 in comp E attacked the low-k substrate and copper. The composition at pH 3.5 in comp. D showed poor resist removal and poor copper corrosion. The resist removal was only satisfactory at pH of 5.5 in comp B. The high ammonium fluoride in comp. C did not increase results over the compositions at pH 7.5. These examples did not evaluate metal redeposition, so the nitric acid was used to change pH. There was no alkaline component in the above examples.

In the following examples, again nitric acid was used to alter pH instead of the preferred acids. These examples below used KrF eximer laser sensitive phenol resin and its residue is best removed with higher DMAC content. The resist was removed with the composition.

| (wt. %) | comp. F | comp. G | comp. 8 | comp. 9 | comp H | comp. 10 | comp. 11 | comp. 12 | comp I | comp J |
|---|---|---|---|---|---|---|---|---|---|---|
| Ammonium fluoride | 0 | 0.1 | 0.1 | 0.1 | 0.5 | 0.1 | 0.1 | 0.1 | 0.1 | 0.1 |
| DMAC | 56 | 56 | 56 | 56 | 56 | 24 | 40 | 80 | 56 | 56 |
| DGBE | 24 | 24 | 24 | 24 | 24 | 56 | 40 | 0 | 24 | 24 |
| pH | 7 | 5.5 | 6.5 | 7.5 | 7 | 6.5 | 6.5 | 6.5 | 3.5 | 8.5 |
| Resist removal | X | ◯◯ | ◯◯ | ◯◯ | ◯◯ | ◯◯ | ◯◯ | ◯◯ | ◯◯ | X |
| Cu corrosion | ◯ | ◯ | ◯ | ◯ | ◯ | ◯ | ◯ | ◯ | X | X |
| low-K film etching | ◯ | ◯ | ◯ | ◯ | ◯ | ◯ | ◯ | ◯ | ◯ | X |

This resist is more tolerant of lower pH cleaners, so pH 5.5 was satisfactory. High pH of 8.5 is very bad, but results are excellent at pH 7.5.

The following comparative examples again used nitric, and they cleaned etching residue. The residue contained a lot of carbon, due to the selection of the etching gas.

| (wt. %) | comp. K | comp. L | comp. 13 | comp. 14 | comp M | comp. 15 | comp N | comp J |
|---|---|---|---|---|---|---|---|---|
| Ammonium fluoride | 0 | 0.1 | 0.1 | 0.1 | 0.5 | 0.1 | 0.1 | 0.1 |
| DMAC | 24 | 24 | 24 | 24 | 24 | 56 | 24 | 24 |
| DGBE | 56 | 56 | 56 | 56 | 56 | 24 | 56 | 56 |
| pH | 6.5 | 5.5 | 6.5 | 7.5 | 6.5 | 7.5 | 3.5 | 8.5 |
| Residue removal | X | ◯ | ◯ | ◯ | ◯◯ | ◯ | ◯ | ◯ |
| Cu corrosion | ◯ | ◯ | ◯ | ◯ | ◯ | ◯ | X | X |
| low-K film etching | ◯ | ◯ | ◯ | ◯ | ◯ | ◯ | ◯ | X |

The following examples include an alkaline component, which was either ammonium acetate or ammonium sulfamate. The ammonium sulfamate is sulfamic acid and ammonia.

| (wt. %) | comp. 16 | comp. 17 | example A | example B |
|---|---|---|---|---|
| Ammonium fluoride | 0.1 | 0.1 | 0.1 | 0.5 |
| DMAC | 24 | 40 | 24 | 40 |
| DGBE | 56 | 40 | 56 | 40 |
| Amm. Acetate | 1.5 | 1.5 | | |
| Amm Sulfamate | | | 1.5 | 1.5 |
| pH | 7.5 | 7.5 | 7.5 | 7.5 |
| Residue removal | ◯◯ | ◯◯ | ◯◯ | ◯◯ |
| Cu corrosion | ◯ | ◯ | ◯ | ◯ |
| low-K film etching | ◯ | ◯ | ◯ | ◯ |

While the corrosion resistance of the low-k films have the same satisfactory rating as did examples without the alkaline component, the low-k samples cleaned with residue remover having alkaline component were less corroded than those cleaned with compositions not having alkaline component. The scale used is too coarse to show the minor but important improvement.

Examples 1-2

Fluoride-Containing Cleaner/Remover Solutions

Example 1 is a post-etch residue removal composition for use particularly with copper substrates. Its composition is as follows:

| Component | Amount (wt %) |
|---|---|
| Ammonium fluoride | 0.1 |
| N,N-Dimethylacetamide (DMAC) | 46 |
| Diethylene glycol monobutyl ether (DEGBE) | 13.6 |
| DEQUEST 2000 | 5 |
| Amino-tris(methylenephosphonic acid) | 2.5 |
| Phosphonic acid | 0.2 |
| Water | 2.3 |
| N,N-Diethylethanolamine | 1 |
| Deionized water | balance |

The pH of the composition of Example 1 was measured as about 7.5.

Example 2 is another post-etch residue removal composition for use particularly with copper substrates. Its composition is as follows:

| Component | Amount (wt %) |
|---|---|
| Ammonium fluoride | 0.1% |
| N,N-Dimethylacetamide (DMAC) | 26 |
| Diethylene glycol monobutyl ether (DEGBE) | 48.5 |
| Sulfamic acid | 1.5 |
| N,N-Diethylethanolamine | 2 |
| Deionized water | balance |

The pH of the composition of Example 1 was measured as about 7.5. We found excellent results were consistantly obtained with a variety of substrates at pH of 7 to 8, preferably 7.2 to 7.8.

It was found through extensive testing that formulations having sulfamic acid, or alternatively phosphonic acid and a derivative, both showed less tendency to erode copper and low-k materials, and also exhibited less metal redeposition, than did the formulations using other acids.

Examples 3-4

Bifluoride-Containing Cleaner/Remover Solutions

Example 3 is a post-etch residue removal composition for use particularly with copper and CORAL substrates. Its composition is as follows:

| Component | Amount (wt %) |
| --- | --- |
| Ammonium bifluoride | 0.8 |
| N,N-Dimethylacetamide (DMAC) | 65.4 |
| Monoethanolamine | 0.5 |
| Deionized water | balance |

The pH of the composition of Example 3 was measured to be between about 8.0-8.2.

This is an alternate embodiment of the invention, where the cleaner and residue remover contains: between 0.5% and 1% of ammonium bifluoride, ammonium fluoride, or mixture thereof, between about 55% and 75% of an amide solvent; water; optionally between 0.001 and 0.5% of a chelator, and an alkanolamine or an amine in an amount sufficient to have a pH of between 8 and 8.2.

Example 4 is a post-etch residue removal composition for use particularly with copper and CORAL substrates. Its composition is as follows:

| Component | Amount (wt %) |
| --- | --- |
| Ammonium bifluoride | 0.8 |
| N,N-Dimethylacetamide (DMAC) | 65.4 |
| Tetraammonium EDTA | 0.003-0.04 |
| Deionized water | balance |

The pH of the composition of Example 4 was measured to be between about 8.0-8.2.

It can be seen that higher amounts of fluoride are satisfactory when conventional amounts of a fluoride compound are used, providing the pH is closely regulated to between 8.0 and 8.2.

Example 5

Effect of Fluoride-Containing Cleaner/Remover Solutions On K-Value Shift of Substrates The post-etch residue removal composition of Example 2 was used to clean several substrates at 25 degrees C. by placing these substrates in a bath for about 5 minutes. Afterwards, these various substrates were subject to a baking step at about 200 degrees C. for 30 minutes to remove excess water that might interfere with the measurement of the dielectric constant. The results are shown in the table below:

| Substrate | Initial K Value | K Value After Cleaning |
| --- | --- | --- |
| BD | 2.931 | 2.933 |
| LKD 5109 | 2.250 | 2.252 |
| CORAL | 2.785 | 2.786 |

As can be seen from these results, the post-etch residue removal composition of Example 2 did not substantially effect the dielectric constant of any of the substrates tested, as there was not even a change in the K value on the order of hundredths, which might barely begin to signify some significant effect, but only on the order of a few thousandths in the K value. The composition of Example 2 appeared to minimize the K-value shift for this variety of substrates. As can be seen in FIG. 1, where an SiOC substrate was subjected to the post-etch residue removal composition of Example 2, there was no observable difference in the nature of the substrate, as observed through FTIR spectroscopy.

Figure 2:
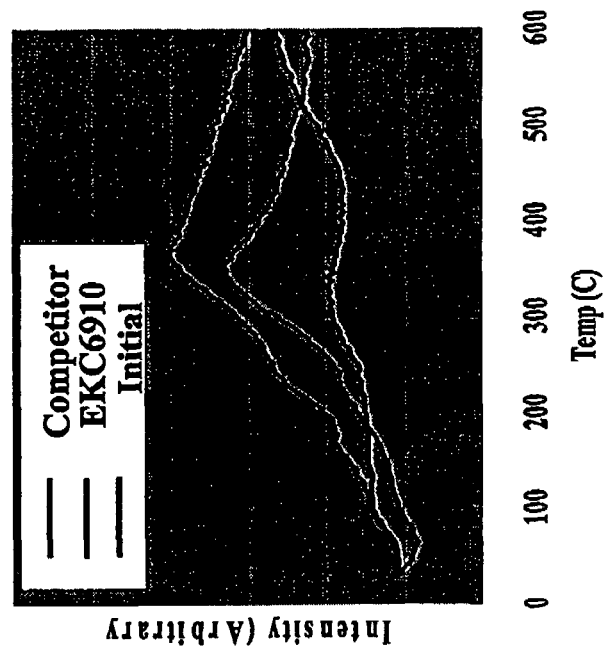
FIG. 2 shows a graph of the effect fluoride-containing cleaner/remover and prior art composition on a SiOC substrate and a MSG substrate.
Figure 2:
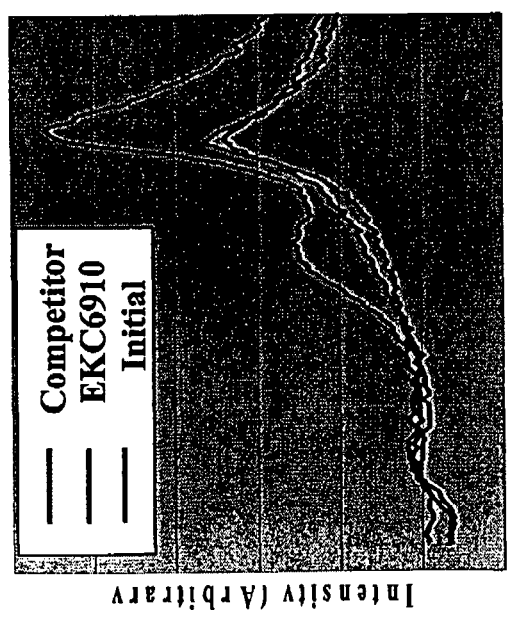

Also, as noted graphically in FIG. 2, where an SiOC substrate and a porous MSQ substrate were subject to a standard Example 2 composition etch and a prior art composition etch, a Thermal Differential Spectrometer (TDS) scan up to about 600 degrees C. (focusing on water) demonstrated that the prior art etch seemed to alter both the substrates to a much greater degree than did the Example 2 composition etch. The most striking is the SiOC substrate, where the Example 2 composition etched curve almost completely overlaps the as-fabricated substrate curve.

Example 6

Effect of Fluoride-Containing Cleaner/Remover Solutions On Etch Rate of Substrates The post-etch residue removal composition of Example 2 was used to clean several substrates at both 25 and 35 degrees C. The resultant etch rate on these various substrates was measured and tabulated below:

| Low-K Layer | Etch Rate at 25 C. | Etch Rate at 35 C. |
| --- | --- | --- |
| BD | <0.1 | <0.1 |
| CORAL | <0.1 | <0.1 |
| LKD 5109 | <0.1 | <0.1 |
| TEOS | <0.1 | <0.1 |
| $Si_3N_4$ | <0.1 | <0.1 |
| SiON | ~0.2 | ~0.4 |
| Cu | <2 | <3 |

All etch rates in the table immediately above are represented in terms of Angstroms per minute. As can be seen from these results, the post-etch residue removal composition of Example 2 only minimally etched most substrate layers. It is desirable for there to be a small etching of copper, as the post-etch residue removal composition of Example 2 is meant to remove copper, copper-containing photoresist, and other residue material from layer surfaces and vias. In fact, surprisingly a lower copper etching rate was observed using the composition of Example 2, which contains no corrosion inhibitor, than for corrosion-inhibitor-containing, low-level-fluoride etch compositions.

Figure 3:
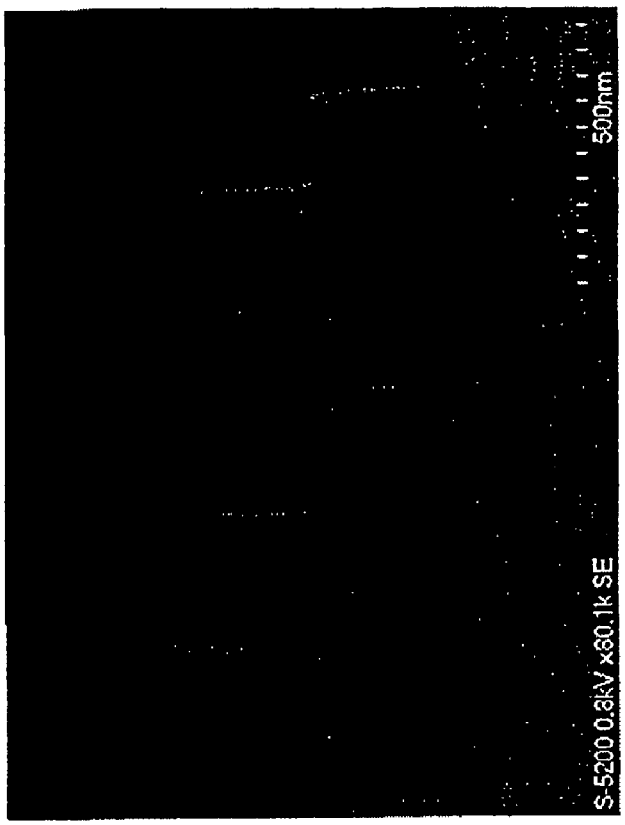
FIG. 3 shows the effect of a fluoride-containing cleaner/remover on a via on a SiOC substrate.
Figure 3:
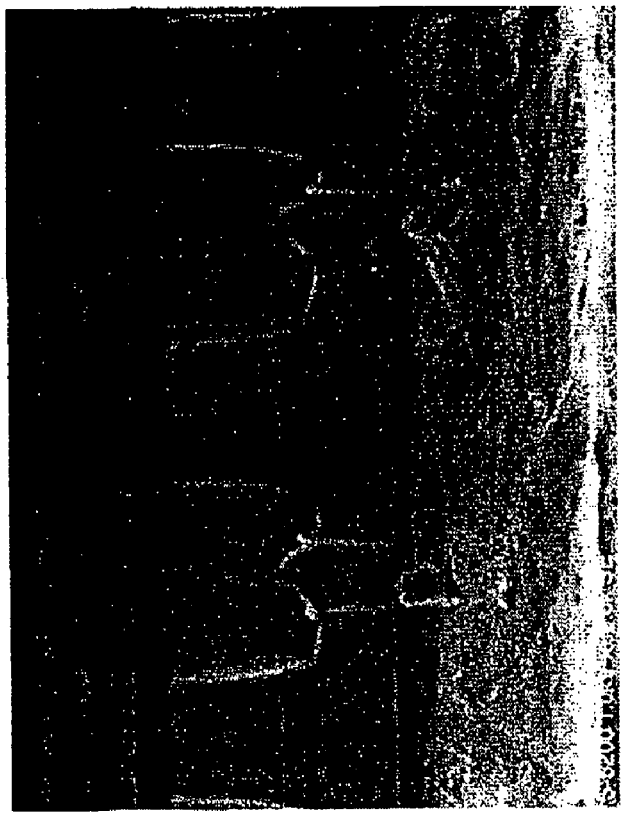

For example, even at the bottom of a via of a copper substrate having fluoride functionality (e.g., from a fluoride-containing plasma etch), which is a difficult-to-reach region of the substrate, the post-etch residue removal composition of Example 2 effectively removes this (copper/copper fluoride) residue, as shown graphically in FIG. 3. Advantageously, the formulations of this invention do not contain corrosion inhibitors.

Figure 4:
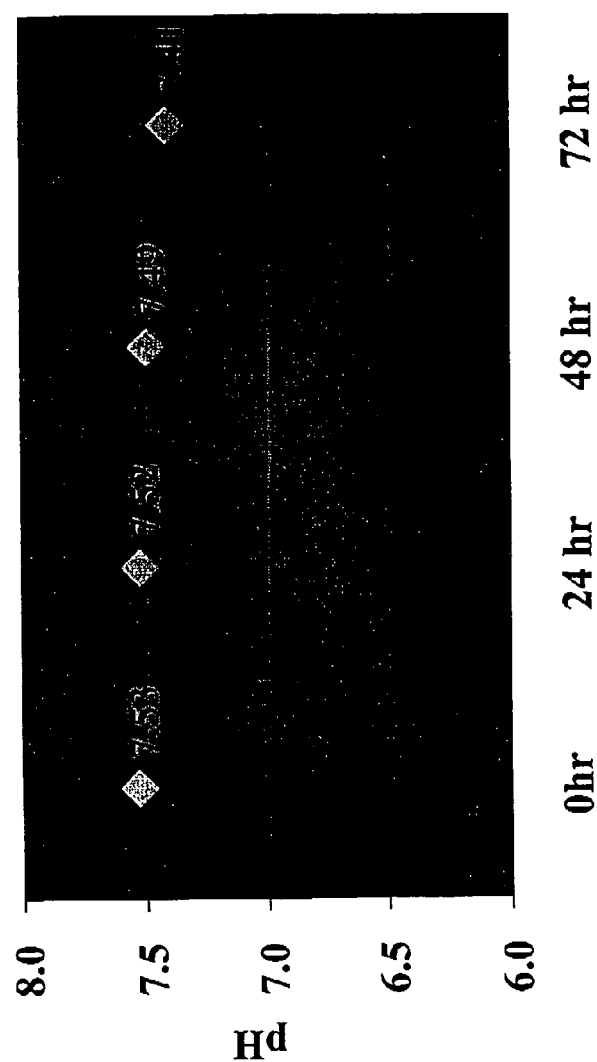
FIG. 4 shows the pH stability of fluoride-containing cleaner/remover solutions.
Figure 5:
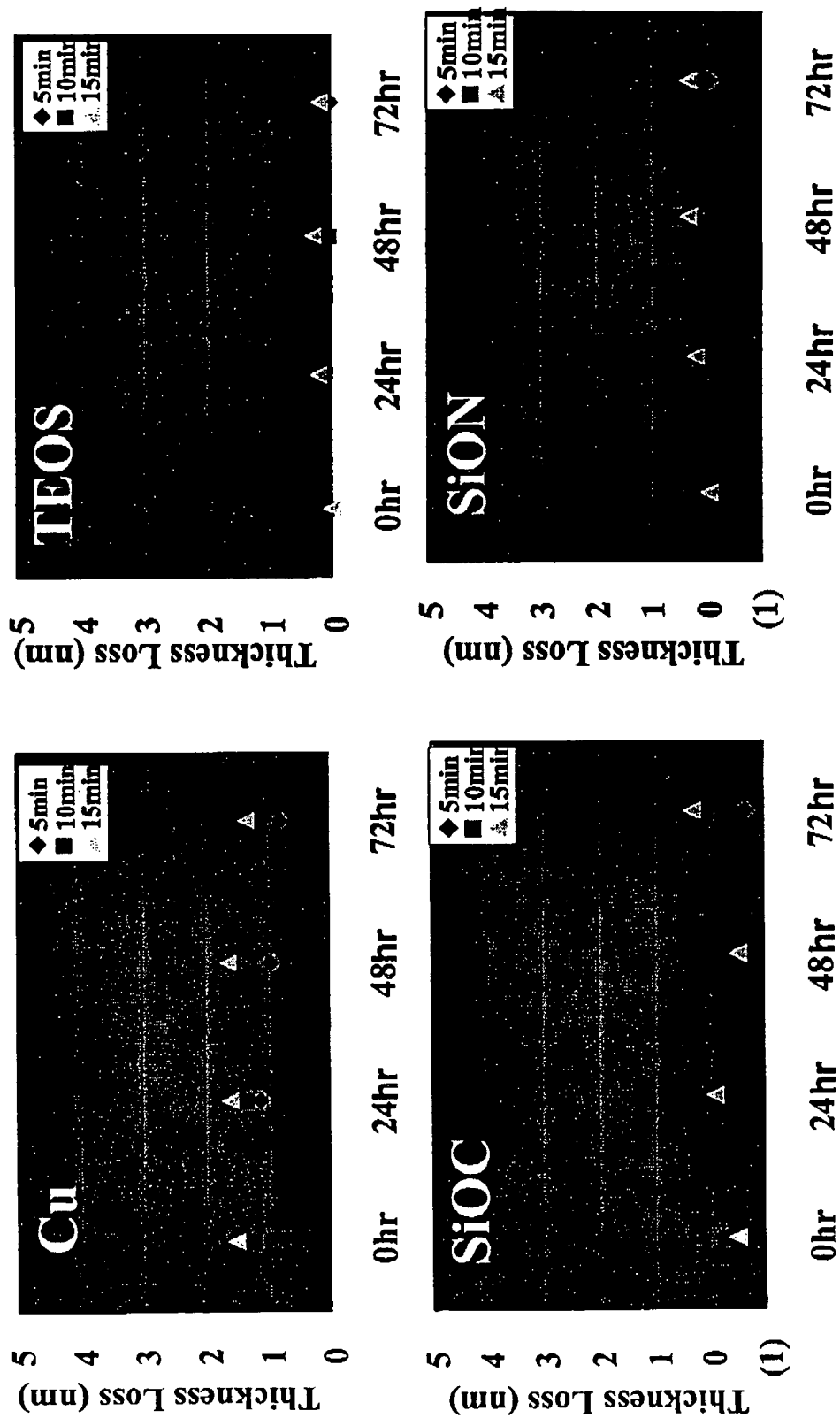
FIG. 5 shows the extended bath life of fluoride-containing cleaner/remover solutions.

Example 7 pH Stability and Extended Bath Life of Fluoride-Containing Cleaner/Remover Solutions A bath containing the post-etch residue removal composition of Example 2 was created to test the longer-term stability of the composition under ambient conditions (see FIG. 4), as well as its relative efficacy as a cleaner/remover on a variety of substrates after certain periods of time (see FIG. 5).

FIG. 4 graphically shows that the pH of the Example 2 composition bath remained extremely stable for at least 48 hours (no significant pH change), and remained very stable even after 72 hours.

FIG. 5 graphically shows the effect of 5-minute, 10-minute, and 15-minute cleaning/removing action on the total etch level (represented by thickness loss in nanometers on the y-axis) for four different substrates (i.e., copper, TEOS, SiOC, and SiON) after the Example 2 composition bath had sat for up to 72 hours ("0 hr" represents the etch level of a freshly made composition on the respective substrates). As noted above for the copper substrate, there does seem to be an increased level of etching, at least as compared to the non-metal substrates, but this is also desirable. It is also noteworthy that the etch level did not significantly change on any substrate for any etch time over a 72-hour period, indicating remarkable bath life stability.

Example 8

Figure 6:
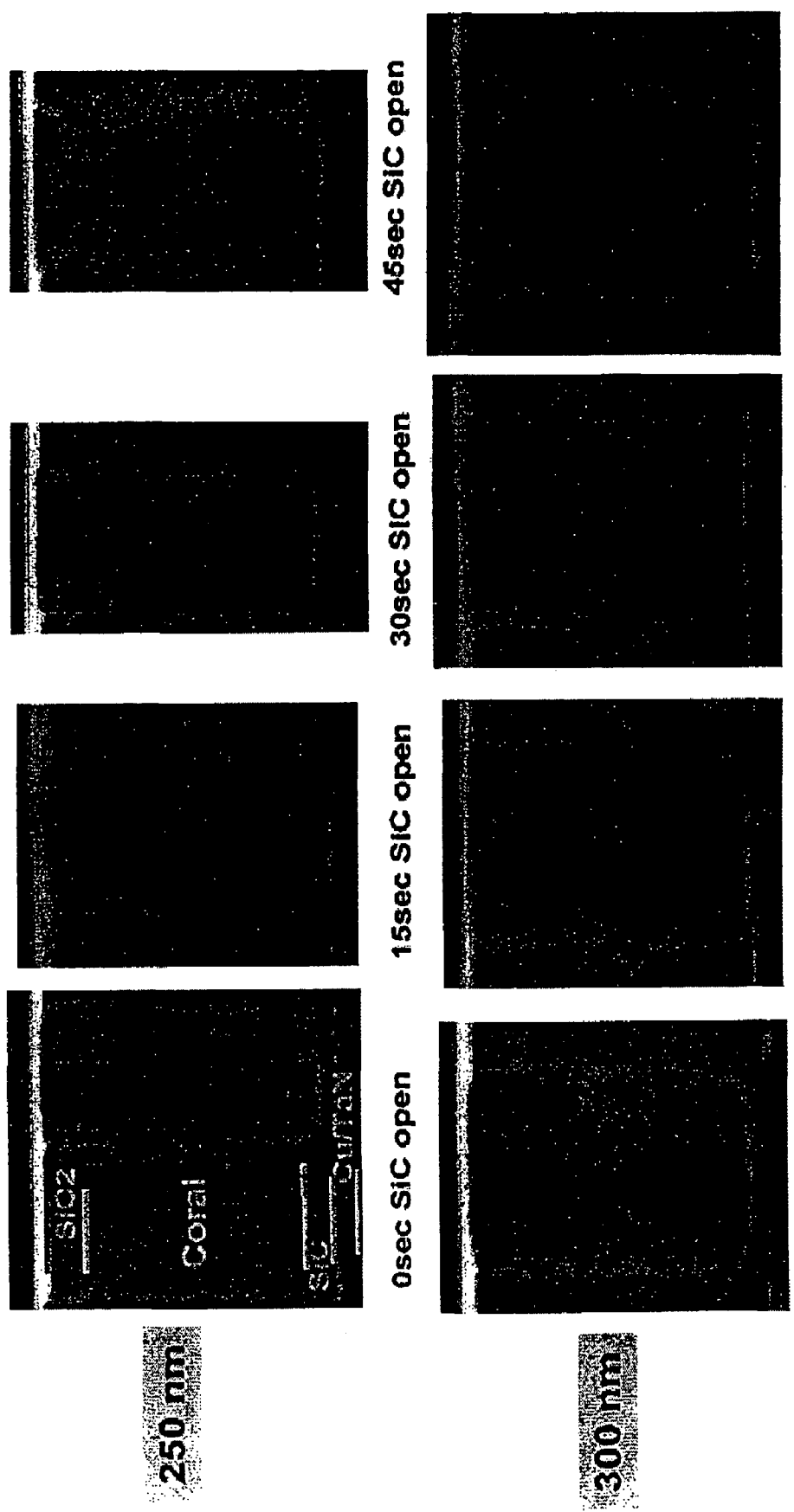
FIG. 6 shows an uncleaned Cu containing substrate before treatment with a fluoride-containing cleaner/remover solution.
Figure 7:
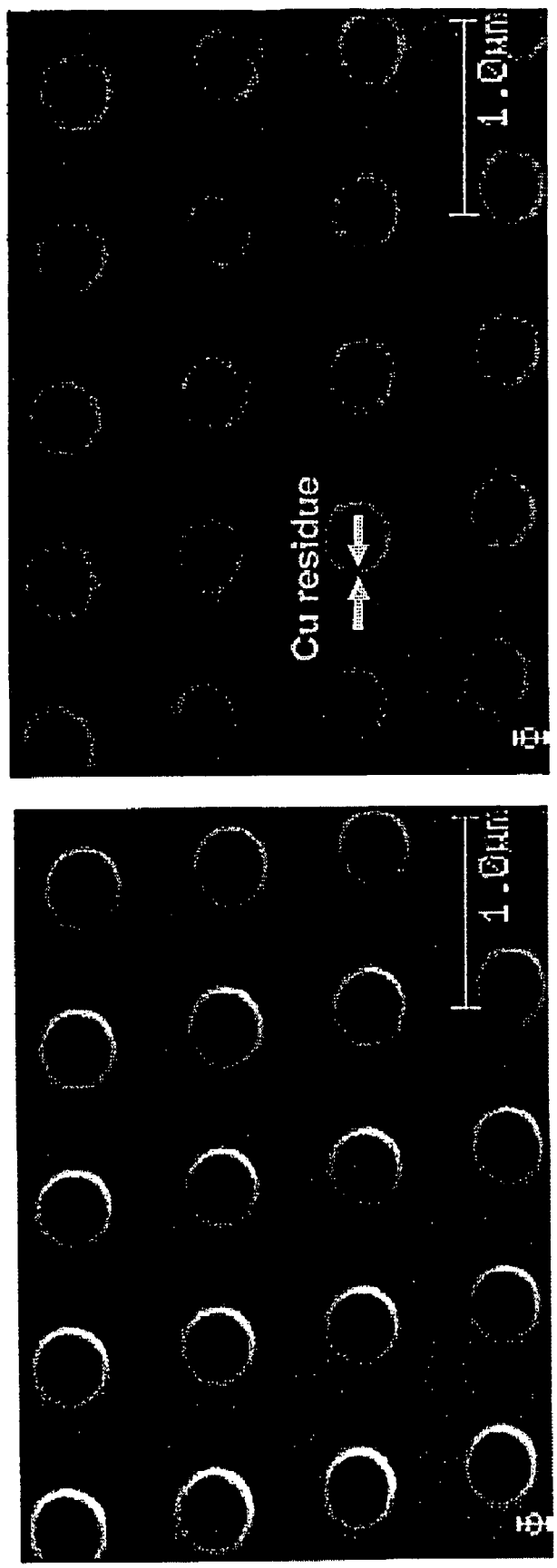
FIG. 7 shows a scanning Electron Microscopy image and CU-specific Auger Electron Spectroscopy image of a Cu containing substrate after treatment with a fluoride-containing cleaner/remover.
Figure 8:
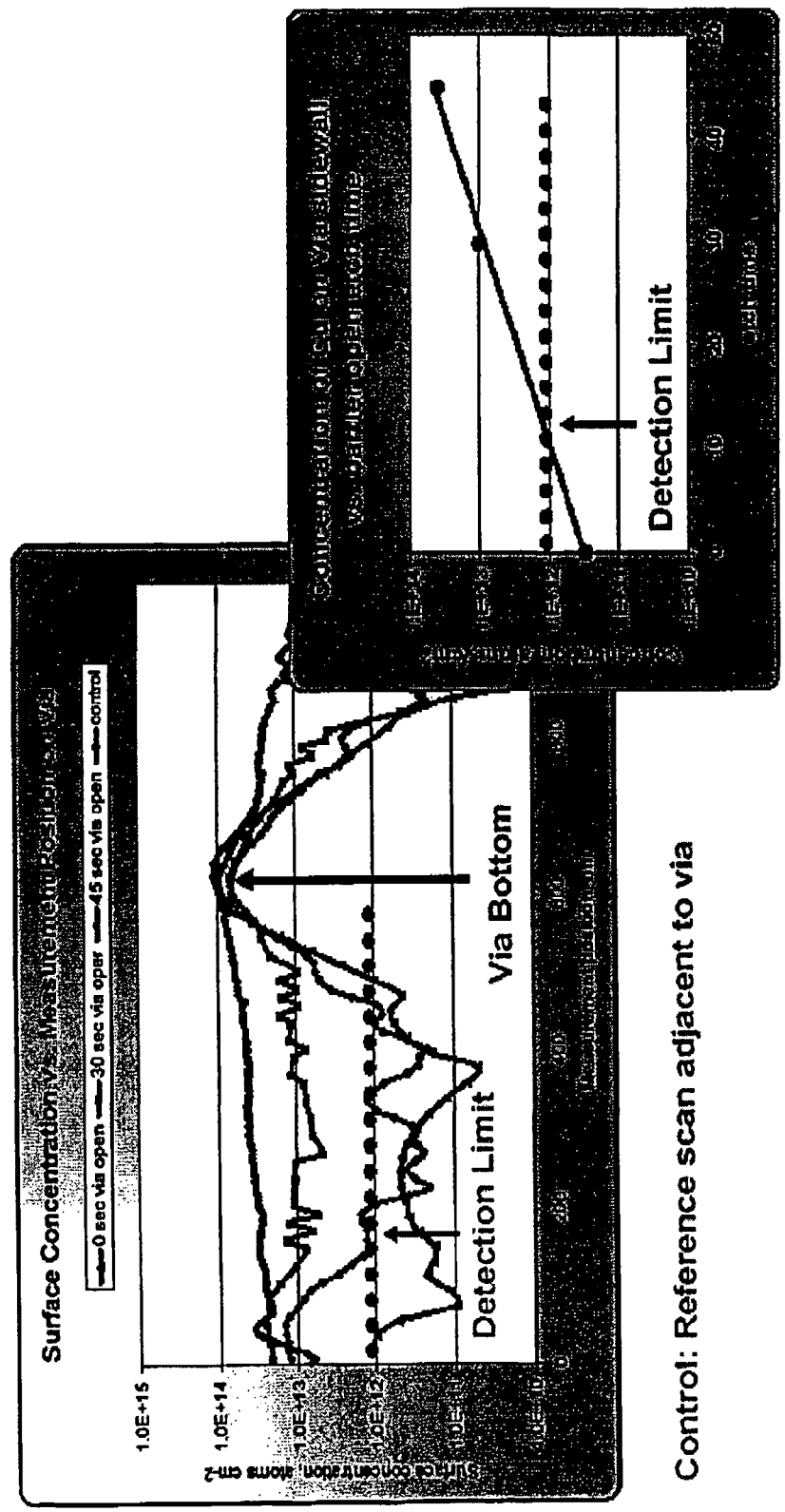
FIG. 8 shows the surface concentration measurement by Dynamic AES of copper as a function of via position or depth.

Effect of Bifluoride-Containing Cleaner/Remover Solutions on Copper Surface Presence and Copper:Silicon Ratio at Positions in the Upper and Lower Via The post-etch residue removal composition of Example 3 was used to clean a substrate having a silica layer upon a CORAL layer upon a SiC layer, upon a Cu/TaN base layer, with vias extending through to the SiC and Cu/TaN layers, as shown in FIG. 6. FIG. 7 shows the Scanning Electron Microscopy (SEM) image and the Cu-specific Auger Electron Spectroscopy (AES) image (where the copper residue can be clearly seen) of the substrate of FIG. 6, as subjected to a 45-second via open cleaning process. FIG. 8 shows the surface concentration measurement by Dynamic FE AES of copper as a function of via position, or depth. As is shown on FIG. 8, a 30-second etch with the composition of Example 3 yields a very low copper concentration on the via sidewalls (approximately 1E13 atoms/cm$^2$), while even a 45-second etch yields an acceptable copper concentration (approximately 5E13 atoms/cm$^2$).

The difference between the etch using the composition of Example 3 and a prior art composition (referred to as the "control") is shown in the table below:

| Etch Composition | Via Position | Cu/Si Ratio (%) | Cu Surface Concentration |
| --- | --- | --- | --- |
| Control | Upper | 1.9 | 9E12 atoms/cm$^2$ |
| Control | Lower | 2.7 | 1.2E13 atoms/cm$^2$ |
| Example 3 | Upper | 0.9 | 4.2E12 atoms/cm$^2$ |
| Example 3 | Lower | 1.4 | 6.3E12 atoms/cm$^2$ |

As can be seen from these results, the post-etch residue removal composition of Example 3 exhibited only about 50% of the copper via sidewall contamination as the prior art "control" composition etch, whether measured as copper surface concentration or as copper:silicon ratio.

Although the present invention is described with reference to certain preferred embodiments, it is apparent that modification and variations thereof may be made by those skilled in the art without departing from the spirit and scope of this invention as defined by the appended claims. In particular, it will be clear to those skilled in the art that the present invention may be embodied in other specific forms, structures, arrangements, proportions, and with other elements, materials, and components, without departing from the spirit or essential characteristics thereof. One skilled in the art will appreciate that the invention may be used with many modifications of materials, methods, and components otherwise used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims, and not limited to the foregoing description.

What is claimed is:

1. A method of cleaning a semiconductor substrate comprising
   providing a semiconductor substrate comprising a low-K substrate with un-ashed resist or incompletely ashed resist residue thereon;
   providing a dilute aqueous cleaner and residue remover comprising:
   from 0.02% to 0.18% by weight of a fluoride-containing compound selected from the group consisting of ammonium fluoride, alkylammonium fluorides, ethanolamine fluoride, ammonium biflouride, alkylammonium bifluorides, or a mixture thereof;
   from 20% to about 40% by weight water;
   from 59% to 85% by weight total of an amide and an ether solvent,
   from 0.2% to 5% by weight of an inorganic acid selected from sulfamic acid, phosphonic acid, or mixture thereof; and
   from 0.2% to 5% by weight of an alkanolamine; wherein said cleaner and residue remover is free of chelators; and
   contacting the semiconductor substrate with the aqueous cleaner and residue remover for a period and under a temperature sufficient to clean the substrate of said resist and/or incompletely ashed resist residue.

2. The method of claim 1 further comprising rinsing the substrate after cleaning, and drying the substrate, wherein the dielectric constant of the low-k substrate after drying is within 0.002 of the dielectric constant before cleaning.

3. A method of cleaning a semiconductor substrate comprising providing a semiconductor substrate comprising a low-K substrate having copper metal thereon and plasma-ashed residue thereon;

providing a dilute aqueous cleaner and residue remover comprising:

between 0.5% and 1% of ammonium bifluoride, ammonium fluoride, or mixture thereof, between about 55 and 75% of one or more amide solvents;

water; and one or more alkanolamines in an amount sufficient to have a pH of between 8.0 and 8.2, wherein said cleaner and remover is free of chelating agents; and contacting the semiconductor substrate with the aqueous cleaner and residue remover for a time and at a temperature sufficient to clean the substrate of residue.

4. The method of claim 3 further comprising rinsing the substrate after cleaning, and drying the substrate, wherein the dielectric constant of the low-k substrate is within 0.002 of the dielectric constant before cleaning.

* * * * *